US008598551B2

(12) United States Patent
Mestrom et al.

(10) Patent No.: US 8,598,551 B2
(45) Date of Patent: Dec. 3, 2013

(54) EUV RADIATION SOURCE COMPRISING A DROPLET ACCELERATOR AND LITHOGRAPHIC APPARATUS

(75) Inventors: Wilbert Jan Mestrom, Roermond (NL); Erik Roelof Loopstra, Eindhoven (NL); Gerardus Hubertus Petrus Maria Swinkels, Eindhoven (NL); Erik Petrus Buurman, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/520,993

(22) PCT Filed: Nov. 29, 2010

(86) PCT No.: PCT/EP2010/068421

§ 371 (c)(1),
(2), (4) Date: Jul. 6, 2012

(87) PCT Pub. No.: WO2011/082891

PCT Pub. Date: Jul. 14, 2011

(65) Prior Publication Data

US 2012/0280149 A1 Nov. 8, 2012

Related U.S. Application Data

(60) Provisional application No. 61/293,143, filed on Jan. 7, 2010.

(51) Int. Cl.

| | |
|---|---|
| ***H05G 2/00*** | (2006.01) |
| ***G03F 7/20*** | (2006.01) |
| ***H05H 1/00*** | (2006.01) |

(52) U.S. Cl.
USPC ................. 250/504 R; 250/493.1; 250/492.3; 378/143; 378/122; 378/119

(58) Field of Classification Search
USPC ........ 250/504 R, 493.1, 492.3; 378/143, 122, 378/119
See application file for complete search history.

(56) References Cited

U.S. PATENT DOCUMENTS

| | | | | |
|---|---|---|---|---|
| 6,738,452 | B2 * | 5/2004 | McGregor et al. | 378/119 |
| 6,933,510 | B2 * | 8/2005 | Zukavishvili et al. | 250/492.2 |
| 7,208,746 | B2 * | 4/2007 | Koshelev et al. | 250/492.2 |
| 7,462,851 | B2 * | 12/2008 | Banine et al. | 250/504 R |
| 2003/0223546 | A1 * | 12/2003 | McGregor et al. | 378/143 |
| 2012/0280149 | A1 * | 11/2012 | Mestrom et al. | 250/492.1 |

FOREIGN PATENT DOCUMENTS

| | | | |
|---|---|---|---|
| EP | 1367441 | A2 | 12/2003 |
| WO | 01/49087 | A1 | 7/2001 |

OTHER PUBLICATIONS

International Search Report for PCT International Patent Application No. PCT/EP2010/068421, mailed on Feb. 28, 2011.

* cited by examiner

*Primary Examiner* — David A Vanore
(74) *Attorney, Agent, or Firm* — Pillsbury Winthrop Shaw Pittman LLP

(57) ABSTRACT

An EUV radiation source includes a fuel supply configured to supply fuel to a plasma formation location. The fuel supply includes a nozzle configured to eject droplets of fuel, and a droplet accelerator configured to accelerate the fuel droplets. The EUV radiation source includes a laser radiation source configured to irradiate the fuel supplied by the fuel supply at the plasma formation location.

15 Claims, 3 Drawing Sheets

EUV RADIATION SOURCE COMPRISING A DROPLET ACCELERATOR AND LITHOGRAPHIC APPARATUS

CROSS-REFERENCE TO RELATED APPLICATIONS

This application is the United States national phase entry of PCT/EP2010/068421, filed Nov. 29, 2010, which claims the benefit of priority from U.S. provisional application No. 61/293,143, which was filed on 7 Jan. 2010, the contents of both of which is are incorporated herein in their entireties by reference.

FIELD

The present invention relates to an EUV radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \tag{1}$$

where λ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength λ, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g. tin), or a stream of a suitable gas or vapor, such as Xe gas or Li vapor. The resulting plasma emits output radiation, e.g. EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

The intensity of EUV radiation which is generated by an LPP source may suffer from unwanted fluctuations. These unwanted fluctuations may have a detrimental effect on the accuracy with which a pattern is imaged onto a substrate by a lithographic apparatus.

It is desirable to provide an EUV radiation source and lithographic apparatus which suffers from smaller fluctuations of EUV radiation intensity than at least some prior art EUV radiation sources and lithographic apparatus.

SUMMARY

According to an aspect of the invention there is provided an EUV radiation source includes a fuel supply configured to supply fuel, such as tin, to a plasma formation location. The fuel supply includes a nozzle configured to eject droplets of fuel, and a droplet accelerator configured to accelerate the fuel droplets. The EUV radiation source includes a laser radiation source configured to irradiate the fuel supplied by the fuel supply at the plasma formation location. The EUV radiation source may be comprised in a lithographic apparatus. The lithographic apparatus may include a support configured to support a patterning device, the patterning device being configured to pattern the EUV radiation to create a patterned radiation beam and a projection system configured to project the patterned radiation beam onto the substrate.

According to an aspect of the invention there is provided a method of generating EUV radiation that includes ejecting a droplet of fuel, such as tin, from a reservoir via a nozzle; accelerating the fuel droplet with a droplet accelerator; and directing a laser beam at the fuel droplet such that the fuel droplet vaporizes and generates EUV radiation.

According to an aspect of the invention, there is provided a lithographic apparatus that includes an EUV radiation source configured to generate EUV radiation. The EUV radiation source includes a fuel supply configured to supply fuel to a plasma formation location. The fuel supply includes a nozzle configured to eject droplets of fuel, and a droplet accelerator configured to accelerate the fuel droplets. The EUV radiation source includes a laser radiation source configured to irradiate the fuel supplied by the fuel supply at the plasma formation location. The lithographic apparatus includes a support configured to support a patterning device, the patterning device being configured to pattern the EUV radiation to create a patterned radiation beam; and a projection system configured to project the patterned radiation beam onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
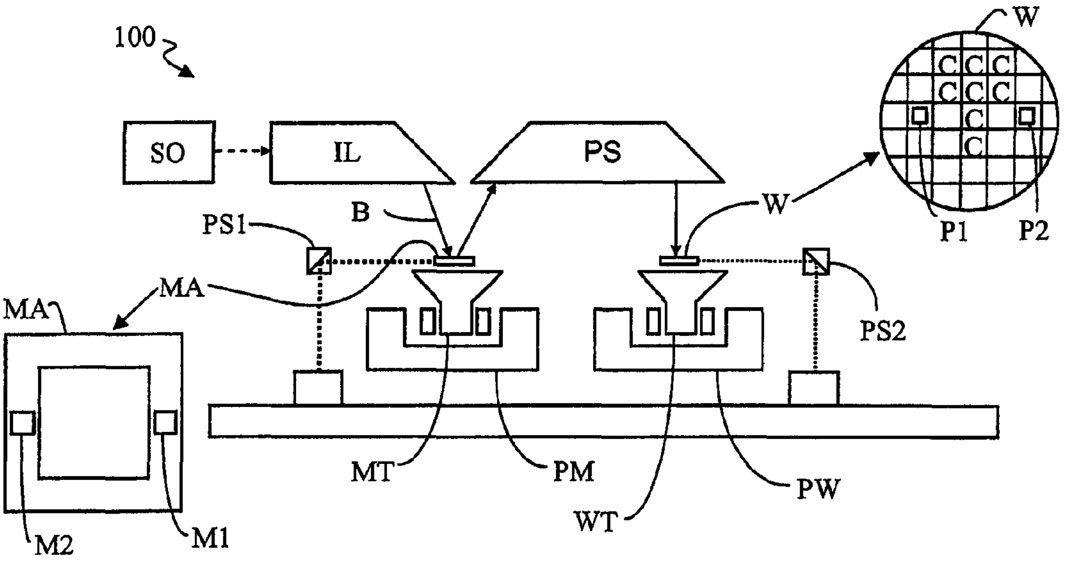
Figure 1 (PRIOR ART)
FIG. 1 schematically depicts a lithographic apparatus according to an embodiment of the invention.

FIG. 1 schematically depicts a lithographic apparatus 100 according to an embodiment of the invention. The lithographic apparatus includes an EUV radiation source according to an embodiment of the invention. The apparatus comprises an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet of material having the required line-emitting element, with a laser beam. The source collector module SO may be part of an EUV radiation source including a laser, not shown in FIG. 1, for providing the laser beam exciting the fuel. The resulting plasma emits output radiation, e.g. EUV radiation, which is collected using a radiation collector, disposed in the source collector module.

The laser and the source collector module may be separate entities, for example when a $CO_2$ laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
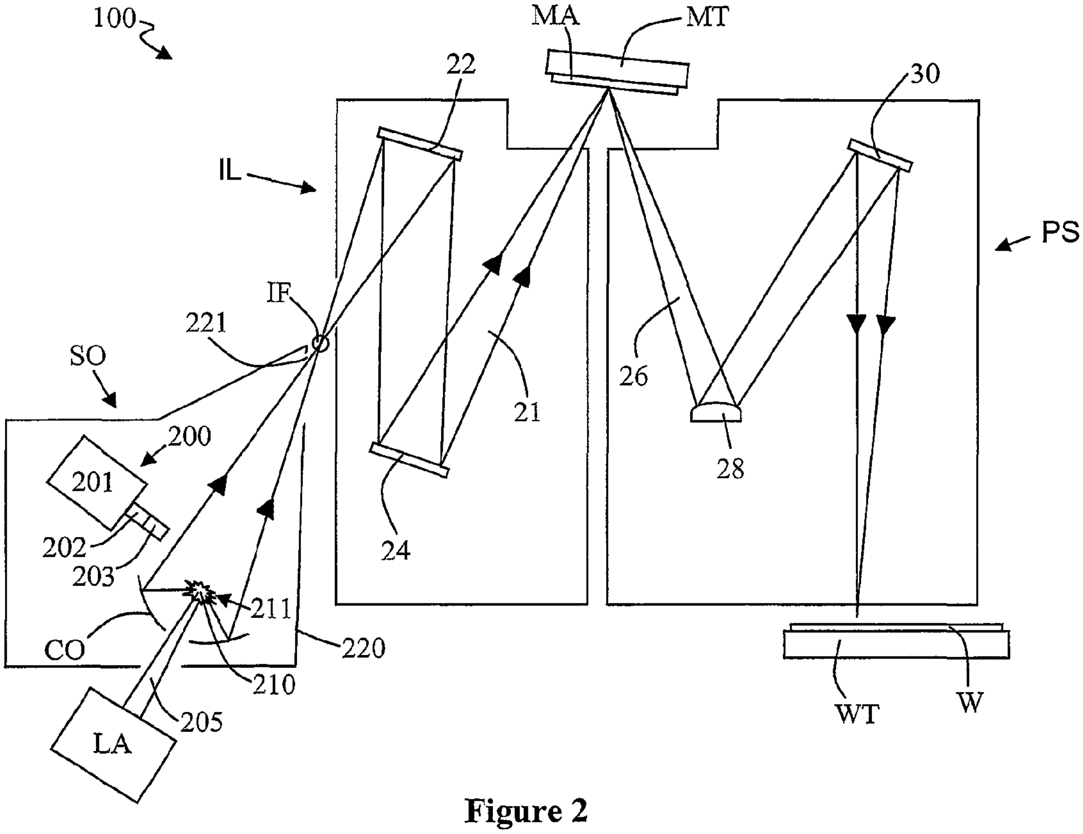
FIG. 2 is a more detailed view of the apparatus of FIG. 1, including an LPP source collector module.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser LA is arranged to deposit laser energy via a laser beam 205 into a fuel, such as xenon (Xe), tin (Sn) or lithium (Li) which is provided from a fuel supply 200. This creates a highly ionized plasma 210 at a plasma formation location 211 which has electron temperatures of several 10's of eV. The energetic radiation generated during de-excitation and recombination of these ions is emitted from the plasma, collected and focussed by a near normal incidence radiation collector CO. The laser LA and fuel supply 200 may together be considered to comprise an EUV radiation source.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in the illumination system IL and projection system PS. Furthermore, there may be more minors present than those shown in the Figures, for example there may be 1-6 additional reflective elements present in the projection system PS than shown in FIG. 2.

The fuel supply 200 comprises a reservoir which contains a fuel liquid (for example liquid tin), a nozzle 202 and a fuel droplet accelerator 203. The nozzle 202 is configured to eject droplets of the fuel liquid towards the plasma formation location 211. The droplets of fuel liquid may be ejected from the nozzle 202 by a combination of pressure within the reservoir 201 and a vibration applied to the nozzle by a piezoelectric actuator (not shown). The fuel droplet accelerator 203 comprises a tube which is supplied with gas that travels in the direction of the plasma formation location 211. This gas accelerates the droplets of fuel towards the plasma formation location 211.

Figure 3A:
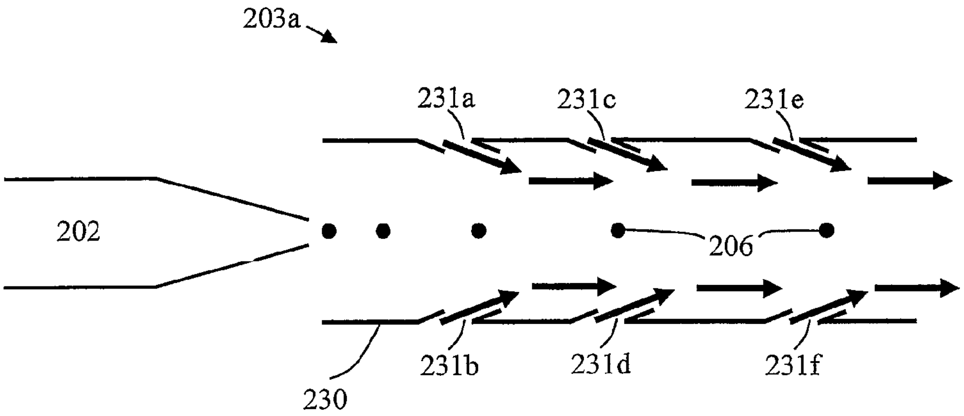
FIGS. 3*a* and 3*b* schematically depict embodiments of a nozzle and fuel droplet accelerator of an EUV radiation source of the lithographic apparatus of FIGS. 1 and 2.

FIG. 3*a* schematically shows the nozzle 202 and a fuel droplet accelerator 203*a* according to an embodiment of the invention. Droplets of fuel 206 which have been ejected by the nozzle 202 are also shown in FIG. 3*a*. The fuel droplet accelerator 203*a* comprises a tube 230 which is provided with a plurality of openings 231*a-f* through which gas flows into the tube. The openings 231*a-f* are configured such that the gas in the tube 230 flows away from the nozzle 202. Flow of the gas within the tube 230 is indicated by arrows in FIG. 3*a*. The gas may for example be hydrogen, or any other suitable gas. The speed of flow of the gas through the tube 230 is higher than the speed with which the fuel droplets 206 are ejected from the nozzle 202. Thus, the gas accelerates the fuel droplets 206 as they travel through the tube 230. This is shown schematically in FIG. 3*a* via an increasing separation between the fuel droplets 206 as they travel along the tube 230.

The speed of flow of gas through the tube 230 may be substantially constant along the length of the tube, or may vary along the length of the tube.

In one example, the droplets of fuel are ejected from the nozzle with a speed of around 50 m/s. The flow of gas along the tube 230 is significantly higher than 50 m/s, and thus the gas accelerates the fuel droplets 206 to a speed which is significantly higher than 50 m/s.

Although six openings 231*a-f* are shown in FIG. 3*a*, any suitable number of openings may be used to introduce gas into the tube 230. One or more openings may be provided at different locations along the tube. One or more sets of openings may be distributed around the circumference of the tube 230. Each opening may for example comprise a nozzle through which gas is supplied. In an alternative arrangement, an opening may extend around the circumference of the tube 230, or may extend partially around the circumference of the tube 230.

The openings 231*a-f* shown in FIG. 3*a* include nozzles which project into the tube 230, the nozzles being indicated schematically by pairs of lines which extend into the tube. In an alternative arrangement, nozzles may be provided in recesses in the tube 230, such that they do not extend into the tube.

The tube 230 may be heated. For example one or more heaters (not shown) may be provided which are used to heat the tube 230 to a desired temperature. The one or more heaters may be formed integrally with the tube 230 or may be provided separately from the tube. The heaters may be configured such that the temperature of the tube 230 is substantially constant at all locations along the tube, or may be configured such that the temperature of the tube increases as the distance away from the nozzle 202 increases. The temperature of the tube 230 may condition the flow of gas within the tube, and thus may enhance the acceleration of the fuel droplets 206 which is provided by the gas.

In an embodiment, heaters are not provided. The gas flow nevertheless provides a significant increase of the speed of travel of the fuel droplets 206.

The tube 230 may be cylindrical in cross-section, or may have any other suitable cross-sectional shape.

Figure 3B:
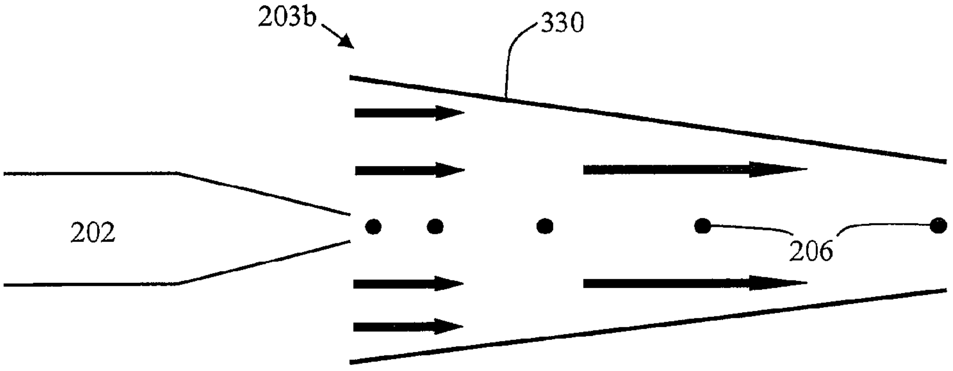

FIG. 3*b* schematically shows the nozzle 202 and a fuel droplet accelerator 203*b* according to an embodiment of the invention. Droplets of fuel 206 ejected from the nozzle 202 are also shown in FIG. 3*b*. The fuel droplet accelerator 203*b* comprises a tapered tube 330 which tapers away from the nozzle 202.

The tapered tube 330 receives gas at a location adjacent to the nozzle 202, the gas flowing along the tapered tube 330 and away from the nozzle 202. The gas may for example be provided by one or more openings (not shown) which are arranged to introduce gas into the tapered tube 330 with a desired speed of flow. The gas may for example be hydrogen, or any other suitable gas.

The tapering of the tapered tube 330 causes the speed of flow of the gas to increase as it travels along the tapered tube 330. This is indicated schematically in FIG. 3*b* by the increasing length of arrows, which represent the flow of the gas. The gas accelerates the fuel droplets as they travel through the tapered tube 330. This is shown schematically in FIG. 3*a* via an increasing separation between the fuel droplets 206 as they travel along the tube 330. The acceleration of the fuel droplets 206 is such that the fuel droplets exit the tapered tube 330 with a speed which is higher than the speed with which the fuel droplets are ejected from the nozzle 202.

The pressure of the gas in the tapered tube 330 decreases as the speed of flow of the gas increases, according to Bernoulli's principle. This reduction of pressure does not prevent the gas from accelerating the fuel droplets 206.

In one example, the droplets of fuel are ejected from the nozzle with a speed of around 50 m/s. The gas flowing along the tapered tube 330 accelerates to a speed which is significantly higher than 50 m/s, and thus the gas accelerates the fuel droplets 206 to a speed which is significantly higher than 50 m/s.

One or more heaters (not shown) may be used to heat the tapered tube 330 to a desired temperature. The one or more heaters may be formed integrally with the tapered tube 330 or may be provided separately from the tube. The heaters may be configured such that the temperature of the tapered tube 330 is substantially constant at all locations along the tube, or may be configured such that the temperature of the tube increases as the distance away from the nozzle 202 increases. The temperature of the tapered tube 330 may condition the flow of gas within the tube, and thus may enhance the acceleration of the fuel droplets 206 which is provided by the gas.

In an embodiment, heaters are not provided. The gas flow nevertheless provides a significant increase of the speed of travel of the fuel droplets 206.

The tube may be cylindrical in cross-section, or may have any other suitable cross-sectional shape.

One or more openings may be provided in the tapered tube 330, the openings being configured to allow gas to be introduced into the tapered tube.

The fuel droplet accelerator 203 accelerates the fuel droplets such that they arrive at the plasma formation location 211 with a speed which is significantly higher than their speed when they are ejected from the nozzle 202. This increased speed of the fuel droplets 206 may provide two potential advantages.

The first potential advantage relates to the fact that a fuel droplet generates a shockwave when it is vaporized by the laser beam 205. This shockwave will be incident upon a subsequent fuel droplet which is travelling towards the plasma formation location 211. The shockwave may modify the direction of travel of the fuel droplet such that the fuel droplet will not pass through an optimally focussed portion of the laser beam 205 at the plasma formation location 211 (see FIG. 2), and thus may not be vaporized in an optimum manner. The increased speed of fuel droplets provided by the fuel droplet accelerator 203 increases the separation between the fuel droplets (for a given EUV plasma generation frequency). The shockwave is spherical, and has an energy which decreases quadratically as a function of distance from the plasma formation location. Thus, increasing the separation between fuel droplets reduces the force of the shockwave on a subsequent fuel droplet. Furthermore, since the subsequent fuel droplet is travelling more quickly, it has higher momentum and thus is affected less by the shockwave. Both of these effects reduce the extent to which the direction of travel of the subsequent fuel droplet is modified by the shockwave, and consequently the subsequent fuel droplet passes closer to the optimally focussed portion of the laser beam 205 at the plasma formation location. Therefore, the fuel droplet may be vaporized more consistently and efficiently.

The second potential advantage relates to the fact that the laser beam 205 exerts force on each fuel droplet, which pushes each fuel droplet away from the plasma formation location 211. Deviation of the fuel droplet away from the plasma formation location 211 is undesirable, because the fuel droplet will not pass through an optimally focussed portion of the laser beam 205, and thus the fuel droplet may not be vaporized in an optimum manner. Increasing the speed of the fuel droplets reduces the deviation of fuel droplets from the plasma formation location 211 caused by the laser beam 205. As a result, the fuel droplet will pass closer to an optimally focussed portion of the laser beam 205, and thus the fuel droplet may be vaporized more consistently and efficiently.

Both of the above potential advantages may allow the fuel droplets 206 to be delivered to the plasma formation location 211 with improved accuracy. This in turn may allow vaporization of the fuel droplets to be achieved more consistently and efficiently. Thus, EUV radiation may be provided with a higher and more consistent intensity.

The above description refers to fuel droplets. This may include for example clusters of fuel material, or fuel material provided in other discrete pieces.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. An EUV radiation source comprising:
a fuel supply configured to supply fuel to a plasma formation location, the fuel supply comprising
a nozzle configured to eject droplets of fuel, and
a droplet accelerator configured to accelerate the fuel droplets, the droplet accelerator comprising a tube configured to receive gas to flow through the tube and accelerate the fuel droplets, wherein the tube is provided with one or more heaters configured to heat the tube; and
a laser radiation source configured to irradiate the fuel supplied by the fuel supply at the plasma formation location.

2. The EUV radiation source of claim 1, wherein the tube has a substantially constant cross-section.

3. The EUV radiation source of claim 2, wherein one or more openings are provided in the tube, the openings being configured to introduce the gas to flow through the tube and accelerate the fuel droplets.

4. The EUV radiation source of claim 1, wherein the tube is a tapered tube which tapers away from the nozzle.

5. The EUV radiation source of claim 4, wherein the tube is configured to receive the gas at an end of the tube adjacent to the nozzle.

6. A method of generating EUV radiation, comprising:
ejecting a droplet of fuel from a reservoir via a nozzle;
accelerating the fuel droplet with a droplet accelerator, the droplet accelerator comprising a tube through which gas flows and accelerates the fuel droplet, wherein the tube is heated by one or more heaters; and
directing a laser beam at the fuel droplet such that the fuel droplet vaporizes and generates EUV radiation.

7. The method of claim 6, wherein the tube has a substantially constant cross-section.

8. The method of claim 6, wherein the tube is a tapered tube which tapers away from the nozzle.

9. The method of claim 8, wherein the tapered tube receives the gas at an end of the tapered tube adjacent to the nozzle.

10. The method of claim 6, wherein one or more openings in the tube are used to introduce the gas into the tube.

11. A lithographic apparatus comprising:
an EUV radiation source comprising
a fuel supply configured to supply fuel to a plasma formation location, the fuel supply comprising
a nozzle configured to eject droplets of fuel, and
a droplet accelerator configured to accelerate the fuel droplets, the droplet accelerator comprising a tube configured to receive gas to flow through the tube and accelerate to the fuel droplets, wherein the tube is provided with one or more heaters configured to heat the tube; and
a laser radiation source configured to irradiate the fuel supplied by the fuel supply at the plasma formation location;
a support configured to support a patterning device, the patterning device being configured to pattern the EUV radiation to create a patterned radiation beam; and
a projection system configured to project the patterned radiation beam onto the substrate.

12. The lithographic apparatus of claim 11, wherein the tube has a substantially constant cross-section.

13. The lithographic apparatus of claim 11, wherein the tube is a tapered tube which tapers away from the nozzle.

14. The lithographic apparatus of claim 13, wherein the tube is configured to receive the gas at an end of the tube adjacent to the nozzle.

15. The lithographic apparatus of claim 12, wherein one or more openings are provided in the tube, the openings being configured to introduce the gas to flow through the tube and accelerate the fuel droplets.

* * * * *